United States Patent [19]

Ravetto et al.

[11] Patent Number: 5,552,596
[45] Date of Patent: Sep. 3, 1996

[54] THREE-DIMENSIONAL RADIATION DETECTION DEVICE AND PROCESS FOR THE PRODUCTION OF SAID DEVICE HAVING ELEMENTARY READING CIRCUITS HYBRIDIZED BY WELDING MICROBEADS

[75] Inventors: Michael Ravetto, Meylan; François Marion, Saint Egreve; Jean-Marc Debono, Genoble, all of France

[73] Assignee: Commissariat A L'Energie Atomique, Paris, France

[21] Appl. No.: 369,747

[22] Filed: Jan. 6, 1995

[30] Foreign Application Priority Data

Jan. 19, 1994 [FR] France .................. 94 00530

[51] Int. Cl.⁶ .................................... H01L 31/14
[52] U.S. Cl. ................. 250/208.1; 250/208.2; 250/332; 250/338.4; 250/370.14; 257/777
[58] Field of Search ............... 250/208.1, 208.2, 250/332, 338.1, 338.4, 339.02, 370.14; 257/697, 738, 777, 780, 786

[56] References Cited

U.S. PATENT DOCUMENTS

| | | |
|---|---|---|
| 4,202,007 | 5/1980 | Dougherty et al. ............. 257/697 |
| 4,551,629 | 11/1985 | Carson et al. . |
| 4,618,763 | 10/1986 | Schmitz . |
| 4,680,617 | 7/1987 | Ross ............................. 257/795 |
| 4,703,170 | 10/1987 | Schmitz ...................... 250/214 R |
| 4,792,672 | 12/1988 | Schmitz ...................... 250/214 R |
| 4,794,092 | 12/1988 | Solomon ........................ 437/51 |
| 5,008,541 | 4/1991 | Audaire et al. .............. 250/338.3 |
| 5,103,097 | 4/1992 | Montanari ................... 250/352 |
| 5,131,584 | 7/1992 | Boitel et al. . |
| 5,270,261 | 12/1993 | Bertin et al. ................ 437/209 |
| 5,332,899 | 7/1994 | Wolny et al. ................ 250/332 |

FOREIGN PATENT DOCUMENTS

| | | |
|---|---|---|
| 0317083 | 5/1989 | European Pat. Off. . |
| 0531723 | 3/1993 | European Pat. Off. . |
| 2646558 | 4/1989 | France . |

Primary Examiner—Edward P. Westin
Assistant Examiner—John R. Lee
Attorney, Agent, or Firm—Pearne, Gordon, McCoy & Granger

[57] ABSTRACT

A three-dimensional radiation detection device incorporates a detection array (22) receiving the radiation and supplying signals representing the latter, a circuit for reading these signals comprising a block (24) having at least one stack of elementary reading circuits (28) and an electrical output component (26) connected to the reading circuit. The detection array and the component are respectively fixed to two separate faces of the block.

10 Claims, 7 Drawing Sheets

THREE-DIMENSIONAL RADIATION DETECTION DEVICE AND PROCESS FOR THE PRODUCTION OF SAID DEVICE HAVING ELEMENTARY READING CIRCUITS HYBRIDIZED BY WELDING MICROBEADS

BACKGROUND OF THE INVENTION

The present invention relates to a radiation detection device.

The word "radiation" is understood to more particularly mean infrared, X or γ radiation.

Particular applications of the present invention occur in the field of thermal imaging and e.g. applies to the manufacture of a converter of infrared radiation into visible radiation.

As a result of the miniaturization of integrated circuits, factors limiting the sizes of systems having such circuits are at present the assembly and the interconnections of said circuits. Various methods are known for producing complex, dense systems from integrated circuits.

A first method consists of eliminating the packages of said circuits or chips and directly hybridizing said chips, by means of welding microbeads, to multilayer substrates making it possible to produce interconnections between the chips.

This first method known as the flip chip method makes it possible to hybridize hundreds of chips on ceramic substrates, i.e. the so-called multichip module. This method is described in U.S. Pat. No. 4,202,007.

A second known method, called the "three-dimensional" method makes it possible to bring the interconnections into a reduced volume.

For example, said second method consists of bonding the chips to one another and forming appropriate electrical connections on the edge of the resulting block, so as to be able to interconnect the different chips by their edges, as can be gathered from:

(1) "Packaging takes on a new dimension", European semiconductor conductor, March 1993, p.21;

or hybridize the chips to one another by means of indium microspheres or microbeads, using a self-alignment method, such as is described in:

(2) French patent application 8905542 of Apr. 26, 1989 (cf. also EP-A-395488 and U.S. Pat. No. 5,131,584).

In the infrared detection field, bidimensional detecting devices are known in which, as is diagrammatically shown in FIG. 2, a detection array 2 for detecting a radiation 4 is directly hybridized, by means of indium microbeads 6, to a reading circuit 8 provided with input-output connections 10.

In the bidimensional device of FIG. 1, each detection pixel is associated with a reading pixel formed on the circuit 8 and whose size is equal to the spacing of the detection array.

In the example of the device diagrammatically illustrated in FIG. 2, the detection pixels 12 of the detection array 2 are distributed in accordance with a spacing of 40 µm in the two directions of the plane and the maximum available surface for the reading pixel 14 corresponding to a detection pixel 12, in the focal plane of the device, does not exceed 40×40 µm$^2$.

At present, the aim is to obtain large surface detection planes having an improved resolution of the image and the aim is also to process in an ever higher performance and more complete manner in the focal plane of a detection device, the signals supplied by the detection array of the device, which also requires a large surface area.

FIG. 3 diagrammatically illustrates the obtaining of a large surface area detection plane by the butt-jointing of elementary detection arrays 16 on a reading circuit 18.

In order to achieve the above objectives, it is necessary on the one hand to reduce the spacing of the detection matrix and on the other have a much larger surface for each reading pixel. Clearly these conditions cannot be simultaneously satisfied in a bidimensional detection device.

Thus, for a given detection pixel size, it is not possible to increase in the detection plane the size of the reading pixel associated with said detection pixel.

SUMMARY OF THE INVENTION

The present invention specifically aims at solving the problem of increasing the size of the reading pixels. For solving this problem, the device according to the invention is a three-dimensional device.

More specifically, the present invention relates to a device for the detection of radiation comprising:

a detection array for receiving the radiation and for supplying signals representing said radiation and a circuit for reading signals supplied by the detection array, said device being characterized in that the reading circuit incorporates a block having at least one stack of integrated circuits constituting elementary reading circuits, in that the device also has an electrical output component electrically connected to the reading circuit and in that the detection array and said component are respectively fixed to two separate faces of the block, in that the elementary reading circuits are hybridized to one another by welding microbeads and in that the detection array and the electrical component are hybridized to the corresponding faces of the block by welding microbeads.

According to a preferred embodiment of the device according to the invention, in order to obtain a larger surface for each reading pixel, the reading circuit of the detection pixels is positioned perpendicular to the plane of said detection pixels.

More specifically, according to this preferred embodiment, the detection array and the electrical output component are respectively fixed to two opposite faces of the block, each of these two opposite faces being formed by juxtaposed edges of the elementary reading circuits.

According to a particular embodiment of the device according to the invention, the block has at least two stacks fixed to one another by the faces of elementary reading circuits.

According to another embodiment, the block has at least two stacks fixed to one another by faces formed from juxtaposed edges of elementary reading circuits.

Preferably, the faces of the elementary reading circuits are electrically connected to the edges thereof in order to receive the informations supplied by the detection array.

The device according to the invention can also incorporate cooling means for cooling the block by the four other faces thereof.

The electrical output component can be an interconnection network support. Said component can also be an electronic component able to process the signals which the reading circuit is able to supply.

The present invention also relates to a process for the production of the device according to the invention, characterized in that it comprises the following stages:

the integrated circuits constituting the elementary reading circuits are produced, each integrated circuit comprising, on one of its two faces, welding elements for the hybridizing of said integrated circuit to another of the integrated circuits, said elementary reading elements are hybridized to one another so as to form the stack of integrated circuits, the gaps between hybridized integrated circuits are encapsulated, two opposite faces of the stack formed by juxtaposed edges of elementary reading circuits are machined, so as to flatten said opposite faces, said two opposite faces are treated in such a way as to form there groups of electrical connections intended to be respectively associated with the detection array and the electrical output component and the detection array and the electrical output component are hybridized to the corresponding faces of the stack.

BRIEF DESCRIPTION OF THE DRAWINGS

The invention is described in greater detail hereinafter relative to non-limitative embodiments and with reference to the attached drawings, wherein show.

DETAILED DESCRIPTION OF PREFERRED EMBODIMENTS

Figure 4:
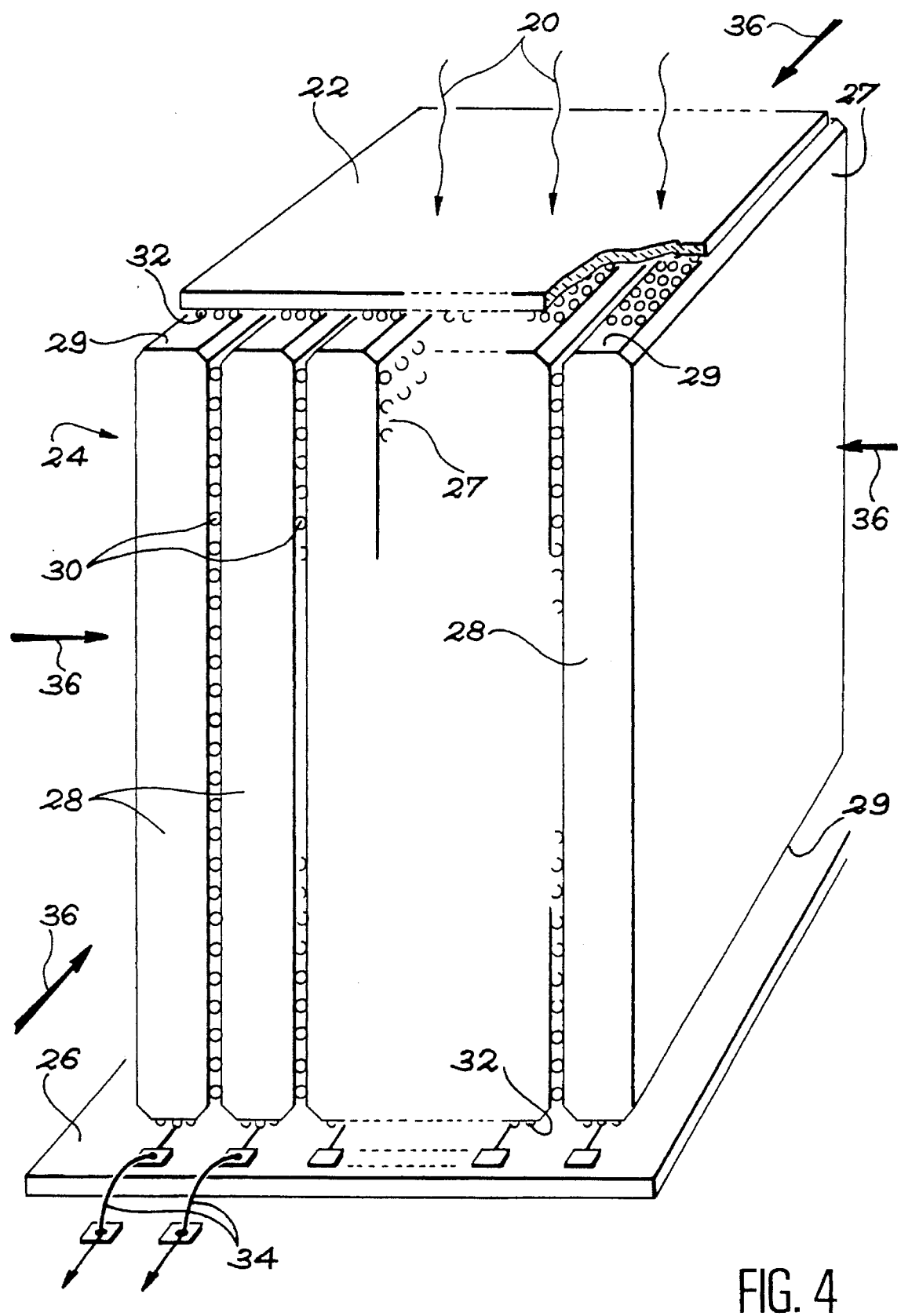
FIG. 4 A diagrammatic view of a particular embodiment of the three-dimensional radiation detection device according to the invention.

The detection device according to the invention and which is diagrammatically shown in perspective in FIG. 4 is to be used for detection of radiation 20, e.g. infrared radiation.

The device of FIG. 4 comprises a radiation detection array 22, which receives said radiation and supplies signals representative thereof, a reading (and optionally processing after reading) circuit 24 for signals supplied by the detection array and an interconnection network support 26.

The reading and optionally processing circuit 24 is a stack of integrated circuits 28 or chips, which constitute elementary reading and optionally processing circuits for the signals supplied by the detection array. This stack forms a substantially parallelepipedic block, which consequently has six faces.

The faces 27 of the elementary circuits 28 are parallel to one another and perpendicular to the plane of the detection array 22 and to the interconnection network support 26.

The array 22 and the support 26 are respectively fixed to two opposite faces of the block 24, each of said opposite faces being formed by juxtaposed edges 29 of the integrated circuits 28, as can be seen in FIG. 4. The integrated circuits 28 are hybridized to one another by welding microbeads 30.

In the same way, the detection array 22 and the support 26 are hybridized by other welding microbeads 32 to the edges of the integrated circuits associated therewith.

The informations from the detection array are transmitted to the faces 27 of the integrated circuits 28 by means of the corresponding edges of said circuits and electrical connections (not shown in FIG. 4), passing from said edges to the faces of said integrated circuits, with a view to a reading and optionally a processing following reading of said informations in said integrated circuits.

The interconnection network support 26 constitutes a passive electrical component, whose function is to ensure the electrical and mechanical interfaces between the stack of integrated circuits 28 and the exterior of the device of FIG. 4, by means of input-output connections such as the connections 34 in FIG. 4.

In a particular, not shown embodiment, the interconnection network support 26 is replaced by an active electrical component, which is able to process signals supplied by the integrated circuits 28, e.g. a display screen for not shown objects emitting infrared radiation 20.

This gives a device for converting infrared radiation into visible light.

It is pointed out that the device of FIG. 4 can be provided with means symbolized by the arrows 36 and which are intended to cool said device by means of the four other faces of the block 24 (faces fixed neither to the array 22, nor to the support 26).

The production of the stack 24 must respect both the spacing of the detection array 22 and the spacing of the connections made on the interconnection network support.

With the device according to the invention shown in FIG. 4, the detection array is read by the circuits having a much larger surface than in the prior art, because use is made of a three-dimensional assembly of integrated circuits, whose planes, on which said reading takes place, are perpendicular to the detection array.

Thus, the device of FIG. 4 makes it possible to bring about a maximum integration of the functions in a very small volume and reduce the lengths of the interconnections between the integrated circuits used and therefore limit the capacities of the lines, which are factors limiting the switching speeds of the known detection devices.

A description will be given hereinafter of a process for the production of the device of FIG. 4, but it is pointed out that this process uses a hybridization method by self-alignment, which is described in the aforementioned document (2).

Figure 1:
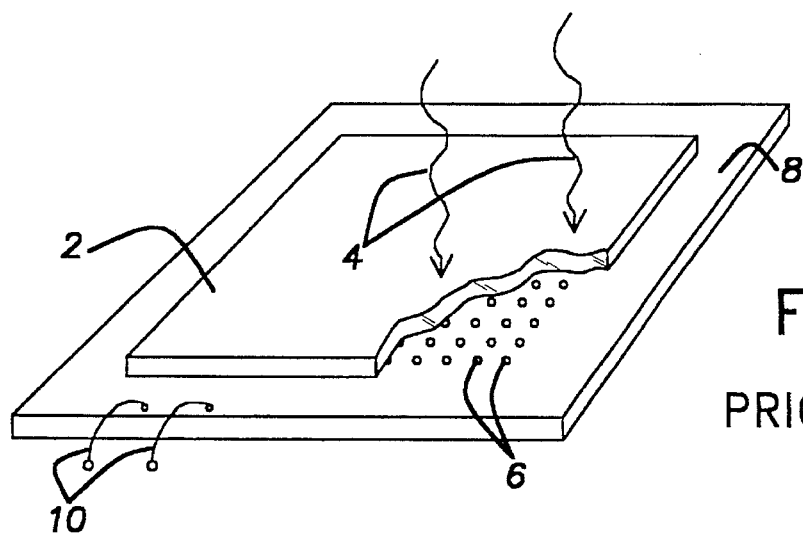
FIG. 1 Already described, a diagrammatic view of a known, bidimensional radiation detection device.
Figure 2:
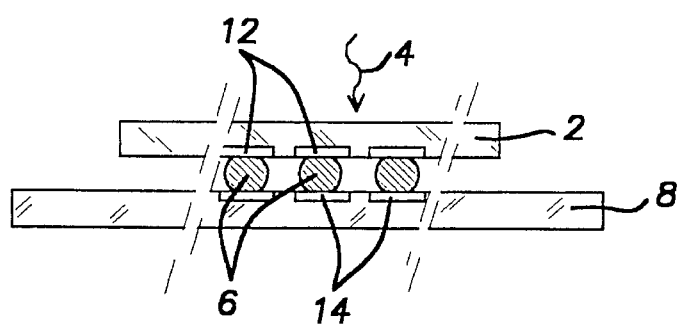
FIG. 2 Already described, a diagrammatic sectional view of such a bidimensional device.
Figure 3:
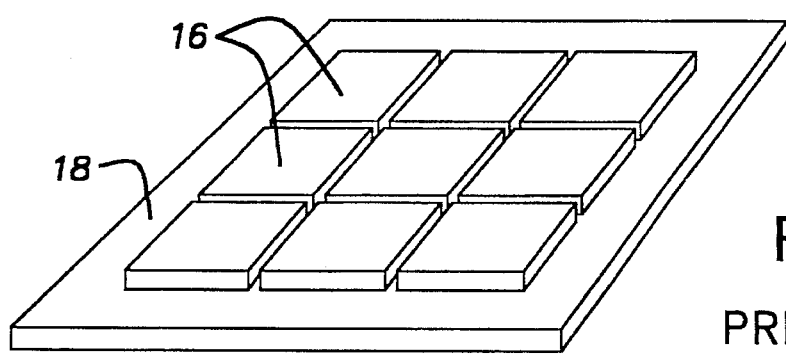
FIG. 3 Already described, a perspective diagrammatic view of another known, bidimensional radiation detection device.
Figure 5:
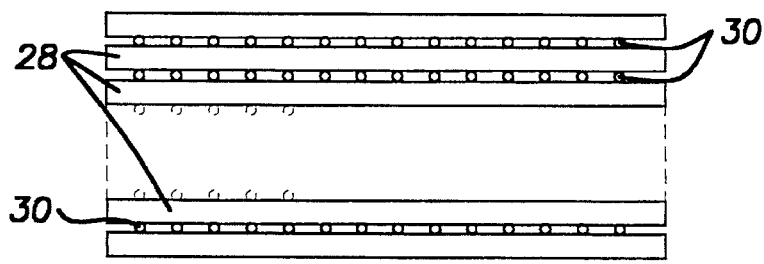
FIG. 5 Diagrammatically a method usable for the production of the device of FIG. 4.
Figure 7:
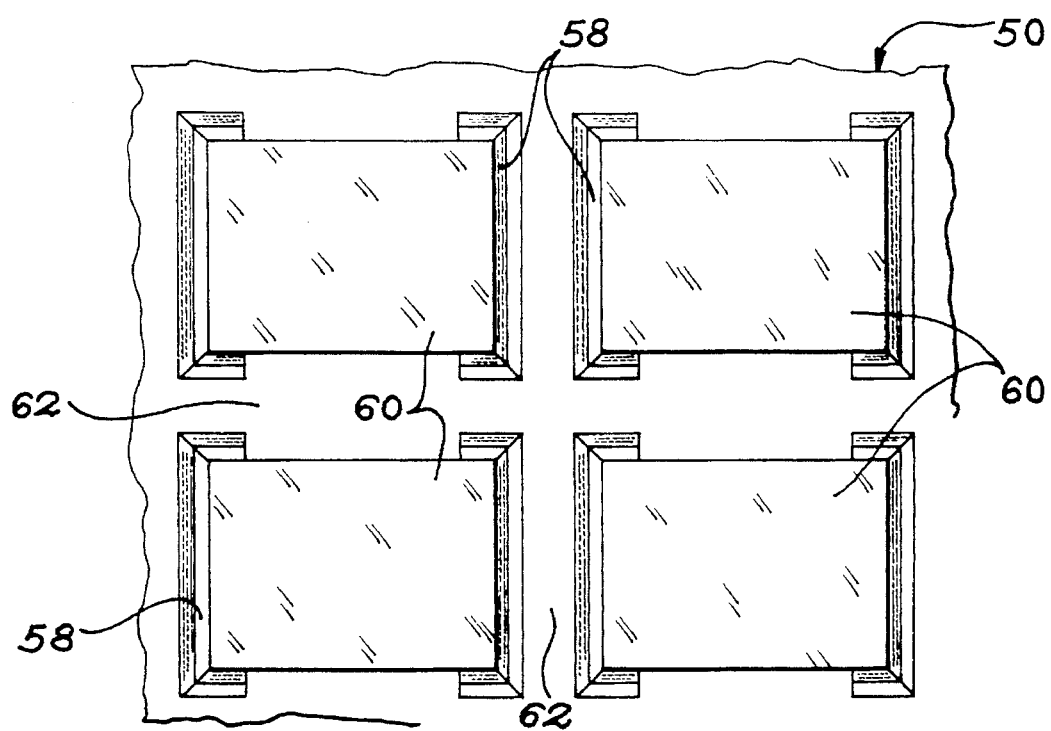
FIG. 7 Diagrammatically the stage of a process according to the invention, in which, on a silicon wafer, are produced integrated circuits making it possible to implement a device according to the invention like that of FIG. 4.

FIG. 5 illustrating very diagrammatically the hybridization of the chips 28 by welding microbeads 30 is to be likened to FIG. 7 of document (2).

Such an assembly method is particularly interesting when it is wished, as is the case here, to obtain a very high precision on the relative positioning of the chips 28 and the gap between said chips 28.

Figure 6:
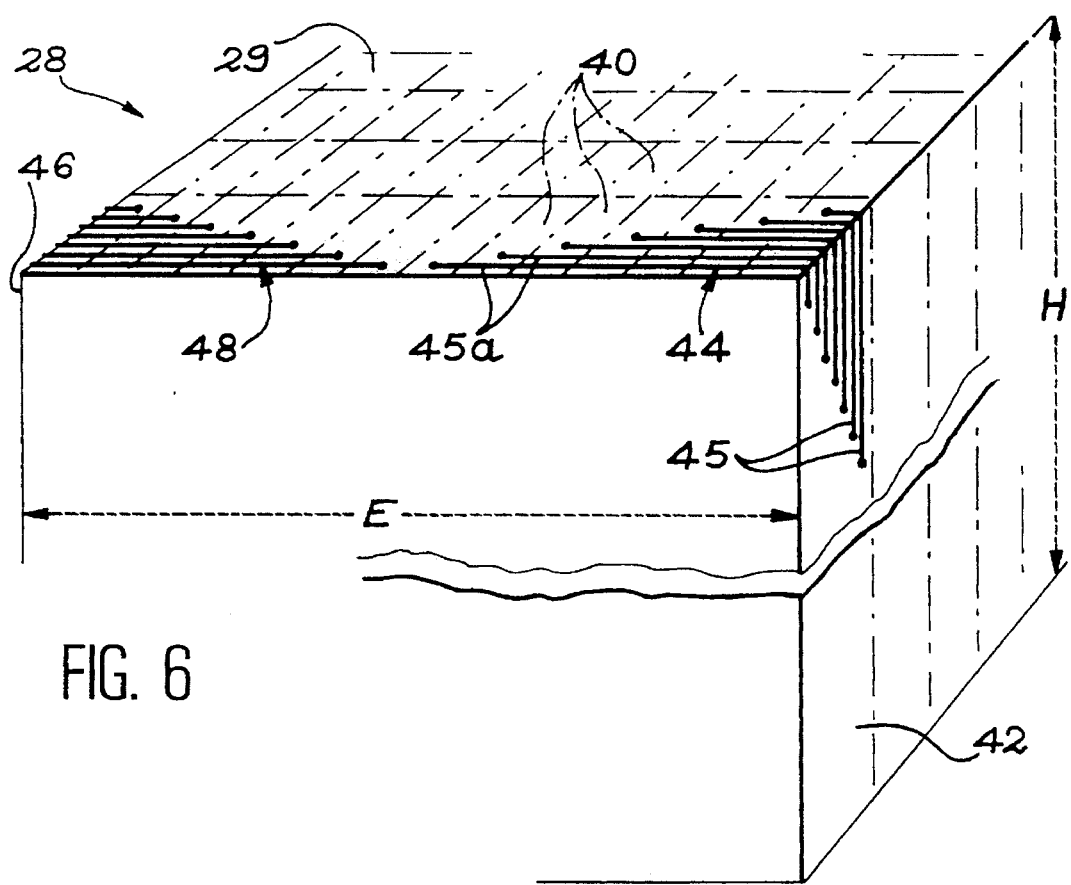
FIG. 6 Diagrammatically electrical connections formed on elementary reading circuits of the device of FIG. 4.

FIG. 6 is a partial, perspective diagrammatic view of an example of the chips 28 used in the device of FIG. 4. It is possible to see an edge 29 of the chip 28, which is to be connected to the detection array.

It is possible to see zones 40 of said edge 29 respectively corresponding to the detection pixels of the detection array 22.

In a purely indicative and non-limitative manner, each detection pixel is a square of side length 35 μm (the zones 40 being shown in the form of rectangles for reasons of clarity in FIG. 6), the thickness E of each chip 28 being 490 μm and thus corresponds to fourteen columns of detection pixels and the height H of each chip 28 can range from a few millimeters to a few centimeters.

For each row of 14 zones 40 of the chip 28, there are seven left-hand zones and seven right-hand zones visible in FIG. 6.

The seven detection pixels corresponding to the seven right-hand zones are read on the face 42 of the chip 28, the corresponding signals being transmitted by seven electrical connections 44 passing from the edge 29 to the face 42, as can be seen in FIG. 6.

The other face 46 of the chip 28 serves as an interconnection network and the signals corresponding to the seven detection pixels associated with the seven left-hand zones reach said interconnection network by means of seven electrical connections 48 passing from the edge 29 to the face 46, as can be seen in FIG. 6.

On face 42 of the chip 28 reading also takes place of seven detection pixels associated with the not shown chip adjacent to the face 42 (but obviously in a zone different from that corresponding to the seven pixels associated with said chip 28), the corresponding pixels reaching the face 42 by means of an interconnection network formed on one face of said adjacent chip and which is the homolog of the face 46 of the chip 28.

In the same way, the seven other pixels associated with the connections 48 of the chip 28 are processed on one face of the not shown chip adjacent to the face 46, which they reach by means of the interconnection network formed on said face 46.

Thus, on each face like the face 42, there is a large reading surface for a detection pixel, namely 35×H/14 μm$_2$ in the example given hereinbefore.

On the side of the interconnection network support 26, electrical connections of the same type as the connections 44 and 48 are provided on the edges and the faces of the chips 28 in order to ensure the desired connections between the reading circuit and the interconnection network support 26.

A description will be given hereinafter of a process for the production of the device shown in FIG. 4. Use is made of a silicon wafer 50 and the two faces of said wafer 50 are treated in the manner described hereinafter.

The first stage is to form on each of the faces of the wafer 50 not shown alignment patterns for the photomasking and etching to be subsequently performed. The respective positions of these alignment patterns are perfectly defined (with the equipments presently used alignments of a standard nature to within 2 μm are obtained).

There is also a formation of connection zones 58, on which will take place the electrical connections between the circuits subsequently formed on the edges and the faces of the chips referred to hereinbefore. These alignment patterns and these connection zones can be produced by chemical etching of the silicon.

Active electrical elements and passive electrical elements are then produced respectively on the two faces of the silicon wafer 50.

Thus, on one of the faces of said wafer 50 are produced elementary patterns 60 constituting the elementary reading circuits of the detection pixels and on the other face interconnection networks are produced, referred to hereinbefore in connection with face 46 of FIG. 6.

On both faces of the wafer 50 are also produced electrical connection lines like the lines 58 in FIG. 7 and which exist on both faces 42, 46 of the wafer 28 and which form part of the connections 44, 48 in FIG. 6.

It should be noted that the elementary patterns 60 provided with connection zones 58 are spaced from one another by separation zones 62 known as "cutting paths" and reserved for the separation of the individual chips.

Figure 8:
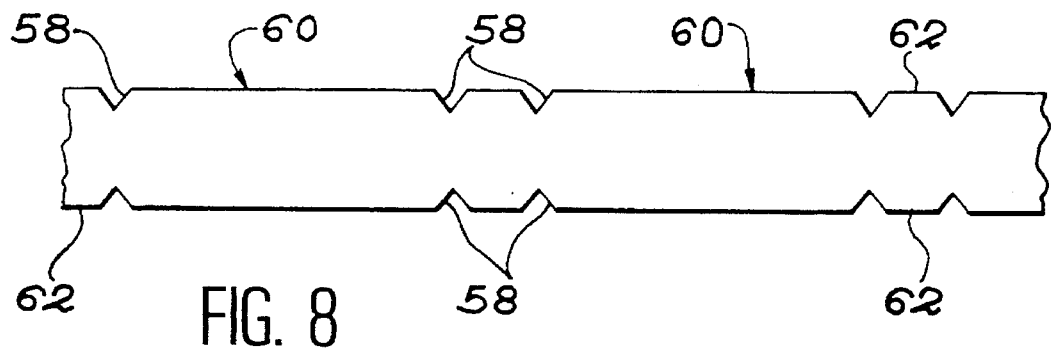
FIG. 8 A sectional view of said silicon wafer in which these integrated circuits are formed.

FIG. 8 is a sectional view of the wafer 50 showing the connection zones 58, the elementary patterns 60 separated from one another by cutting paths 62 and intended to form, after separation, the chips 28.

The treatments of the two faces of the silicon wafer 50 can be firstly carried out on one face and then on the other or on both faces at once, either by performing certain treatment operations at the same time on the two faces in order to take better advantage of the successive depositions and etchings which it is wished to make on both faces.

Figure 9:
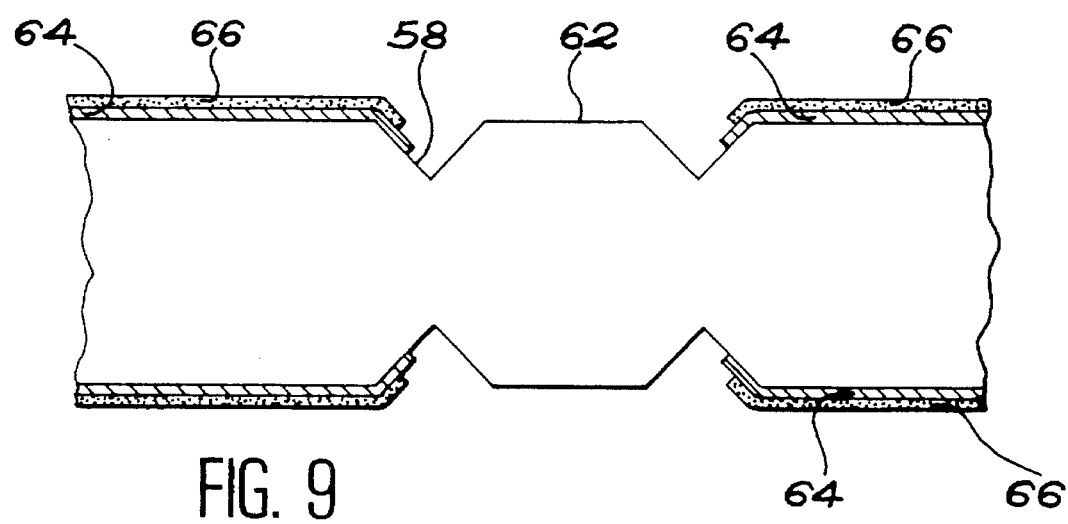
FIG. 9 Diagrammatically the formation of different layers on the two faces of the silicon wafer.

FIG. 9 diagrammatically and partially illustrates respectively conductive and insulating layers 64 and 66 formed on the faces of the silicon wafer 50.

It is pointed out that the successive deposition and etching operations, whose number is a function of the type of circuits to be formed, take place up to the formation of the welding elements (e.g. of indium), which takes place on only one of the two faces of the silicon wafer (with a view to subsequently carrying out the hybridizations of the chips referred to hereinbefore.

Figure 10:
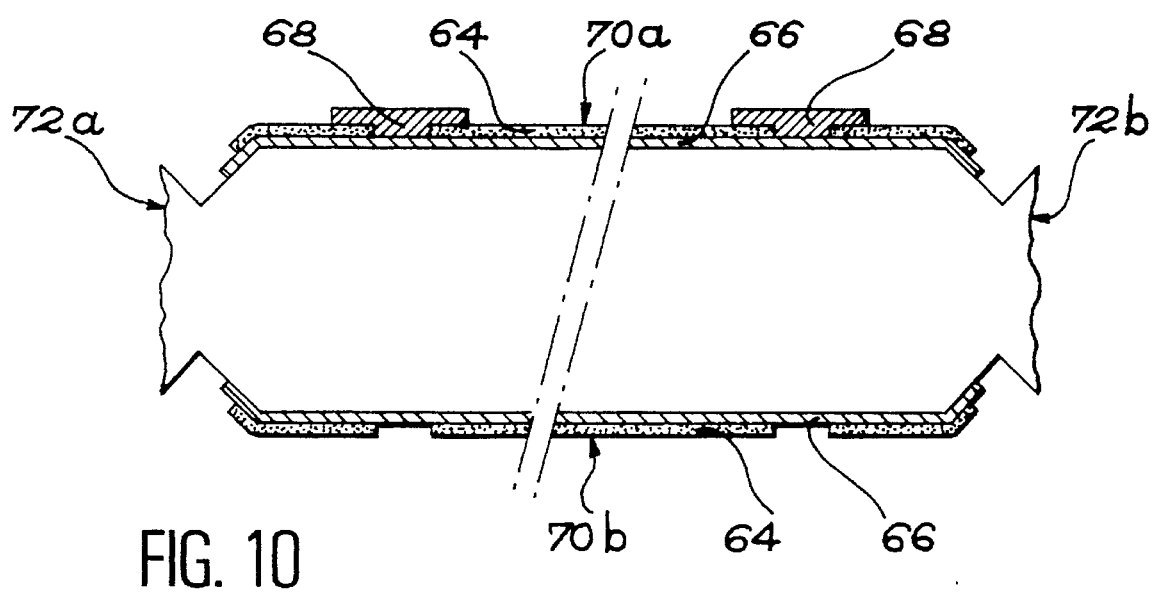
FIG. 10 Diagrammatically an integrated circuit cut from said wafer.

This is followed by the separation from one another of the resulting chips 28, as is diagrammatically illustrated in FIG. 10.

This is a standard separation operation taking place in two perpendicular directions, within the cutting paths 26 provided for this purpose on the silicon wafer 50.

FIG. 10 shows that each chip 28 cut in this way comprises metallic, conductive layers 66 surmounted by insulating, passivating layers 64 on its two faces. The passivating layers 60 have openings permitting the appearance of the surfaces of the layers 66 (forming electrical connections).

As can be seen in FIG. 10, one of the two faces of the chip 28 also has indium welding elements 68 for the hybridization of said chip to an adjacent chip, as will be shown hereinafter.

These welding elements 68 rest on the passivating layers 64 and are in contact, through openings provided in the latter, with the corresponding metallic layers.

The face of the chip 28 having said welding elements carries the reference 70a, whilst the opposite face of the chip 28 is 70b.

The edges of the chip 28 resulting from the separation of said chip from adjacent chips respectively carry the references 72a and 72b.

Figure 11:
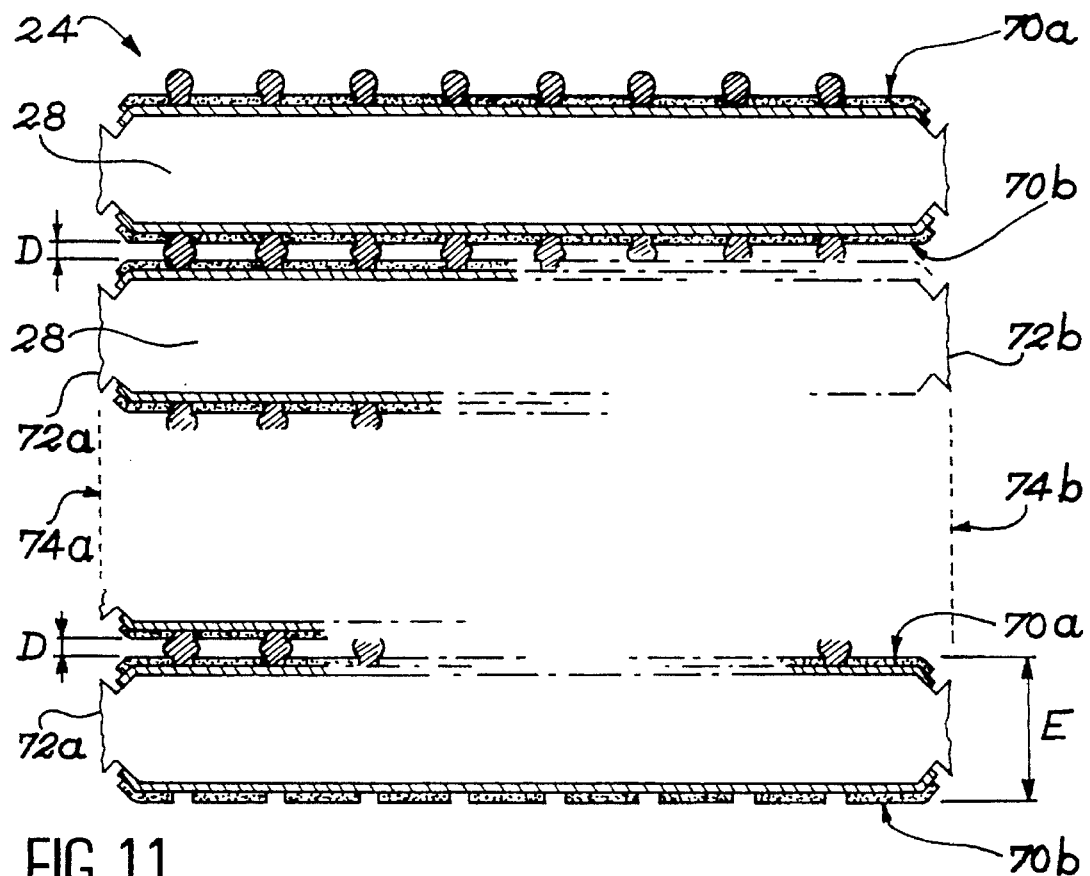
FIG. 11 Diagrammatically a stage in the process according to the invention, in which integrated circuits are hybridized to one another.

Once the welding elements have been formed, the chips 28 are all aligned and stacked, as shown in FIG. 11, so that the faces 70a are in contact with the faces 70b in the stack.

Finally, these chips 28 are hybridized with one another by the welding elements, in accordance with document (2).

The surfaces of the metallic layers not carrying welding elements are clearly wettable by the material of said elements in order to permit the hybridization of a chip to the adjacent chip. The final distance D between two adjacent chips is perfectly defined and reproducible.

In a purely indicative and non-limitative manner, use is made of silicon wafers with an approximate diameter of 100 mm, an approximate thickness of 500 µm (to within 5 µm) and an approximate distance D between two adjacent chips of 10 µm (to within 1 µm).

The thus obtained block has a face 74a constituted by all the edges 72a of the chips and a face 74b, opposite to the other face, formed from all the edges 72b of said chips.

The following stage of the process consists of carrying out a resin encapsulation of the welding hybridization gap between two adjacent chips.

Figure 12:
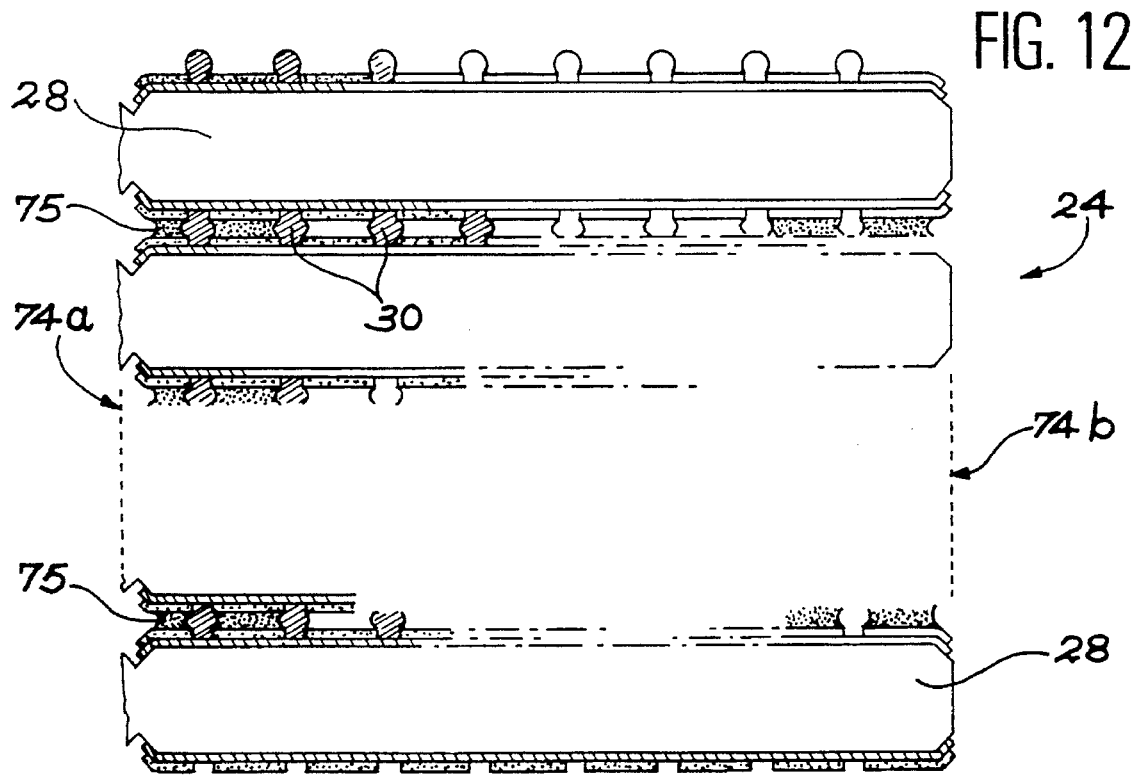
FIG. 12 Diagrammatically another stage of this process, according to which an encapsulation by resin takes place of each hybridization gap, as well as another stage in which the edges of the assembled integrated circuits are levelled or smoothed.

More specifically and as is diagrammatically illustrated in FIG. 12, a resin layer 75 is deposited level with each gap between the chips and said resin wets the faces 70a and 70b up to the welding microbeads 30 (resulting from the hybridization operation) furthest to the outside of the stack.

The function of this resin encapsulation is to protect the active and/or passive elements produced on the faces 70a, 70b of the chips and to mechanically hold said chips with respect to one another for the subsequent stages of the process.

FIG. 12 also diagrammatically illustrates the following stage of the process consisting of mechanically grinding and polishing the faces 74a, 74b of the block 24, corresponding to the edges 72a, 72b, so as to eliminate the cutting residues from the connection zones, as well as a preparation of the thus ground and polished surfaces for the following technical stages.

It is pointed out that the two other faces of the block are treated like the faces 74a, 74b in the case where it is necessary to produce electric circuits there and, in the opposite case, remain in the post-cutting state thereof.

Figure 13:
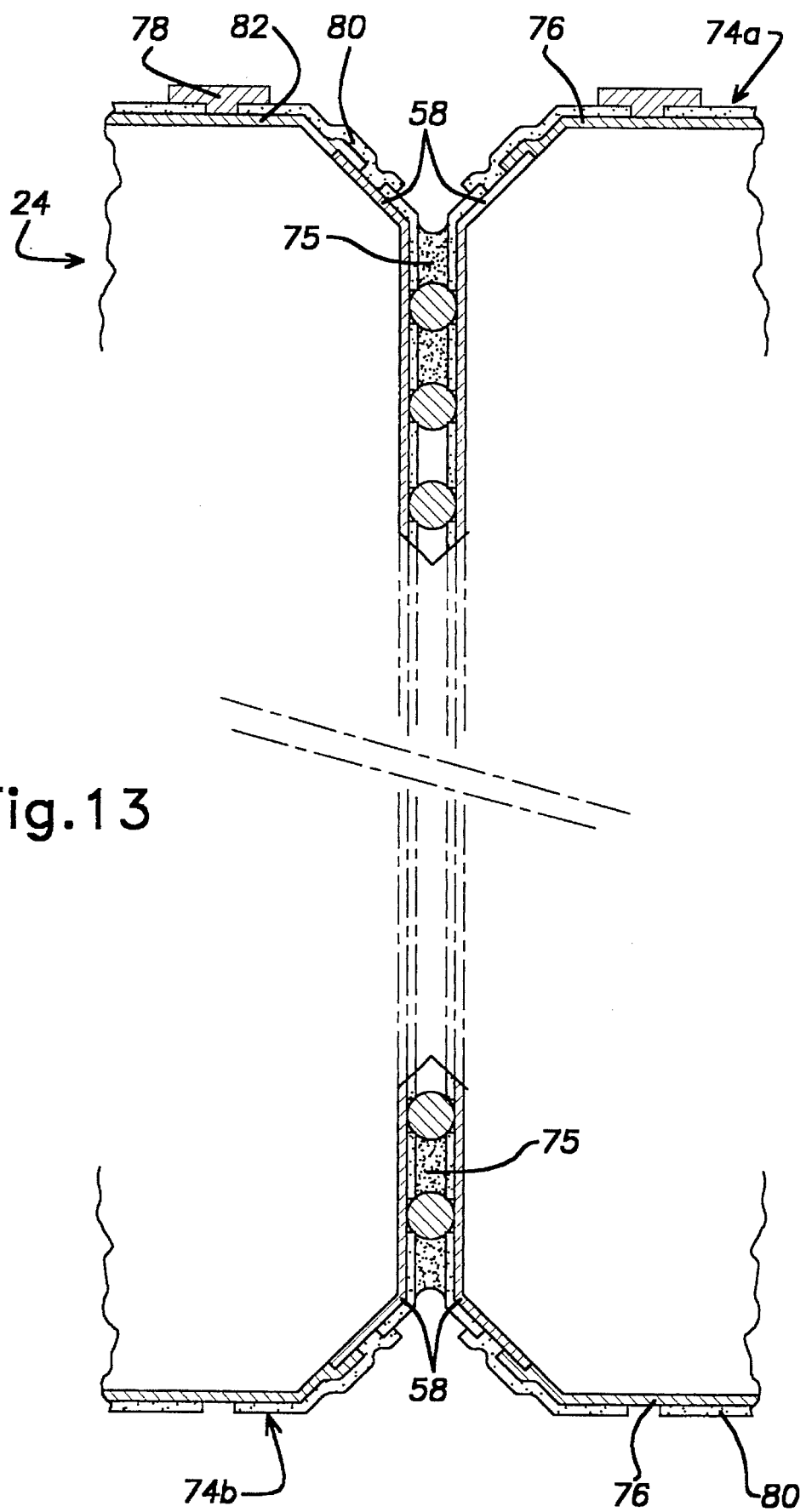
FIG. 13 Diagrammatically another stage in which the levelled faces are provided with electrical connections, one of said faces also being provided with welding elements.

In the following stage the faces 74a, 74b of the block 24 are treated in the manner diagrammatically illustrated in FIG. 13. This treatment is much simpler and in particular less critical than that carried out beforehand on the faces 70a, 70b of the chips 28. It consists of producing interconnection networks without an active function and in the embodiment given this is reduced to:

three masking levels on the face 74 corresponding to the interconnection network support in order to obtain:

a first, not shown metallization corresponding to the electrical connection lines 45a in FIG. 6, respectively extending the lines 45 for forming the connections 44 of FIG. 6, a second specific metallization for the formation of metallic layers 76 for receiving the indium beads 32 formed during the hybridization of the interconnection network support to said face 74b and a passivation between the two metallizations giving the passivating layers 80 having openings to permit a contact between the welding microbeads and the layers 76 on the face 74b and only to five masking levels for the other face 74a of the block 24, namely the three aforementioned masking levels and two other masking levels for producing indium welding elements 82 for the hybridization of the face 74a to the detection array 22 of FIG. 4.

It is pointed out that the alignment of the masking levels takes place from alignment patterns produced during the treatment of the faces of the chips and which now appear on the connection zones 58.

In the stage of treating the faces 74a, 74b, the procedure is such as to take optimum advantage of the depositions and etchings on each of the faces 74a, 74b, particularly the first metallization deposits, the second metallization deposits and the passivation.

Thus, the block 24 of FIG. 4 has been completed carrying the reading and interconnection circuits, said block forming an interface between the detection array (on which has been defined wettable surfaces associated with the welding elements 78 produced on the block 24) and the interconnection network support 26 (on which has been produced welding elements corresponding to the wettable surfaces of the metallic layers 76 produced on the face 74b of the block 24.

As has been shown hereinbefore, this interconnection network support constitutes an interface between the device of FIG. 4 and the exterior.

This is followed by a hybridization by welding microbeads of the face 74a of the block 24 with the detection array 22 and the face 74b of the block 24 with the interconnection network support 26. In this connection reference should once again be made to document (2). This gives the device shown in FIG. 4.

Figure 14:
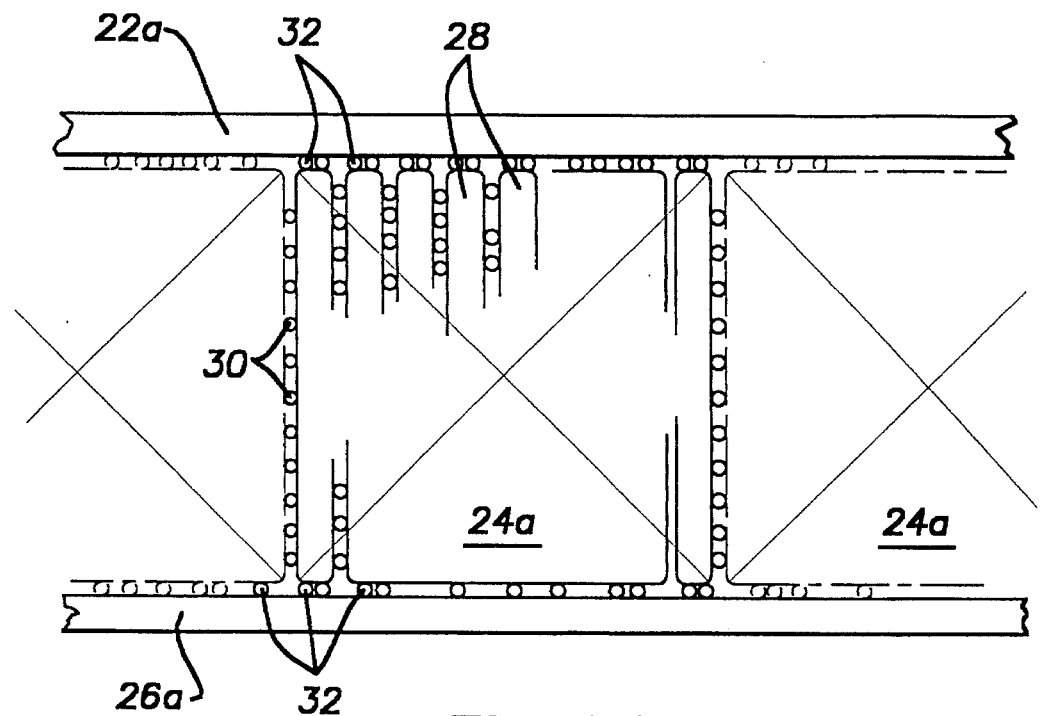
FIG. 14 Diagrammatically another three-dimensional device according to the invention.

Another detection device according to the invention is diagrammatically and partially shown in FIG. 14 and comprises, in place of a single block as in FIG. 4, a plurality of blocks 24a, each formed from chips 28 (like the block 24 in FIG. 4).

These blocks 24a are hybridized by welding microbeads 30 and form a row, which is inserted between a detection array 22a and an interconnection network support 26a, the latter being hybridized by welding microbeads 32 to different chips 28 of the blocks 24a.

Figure 15:
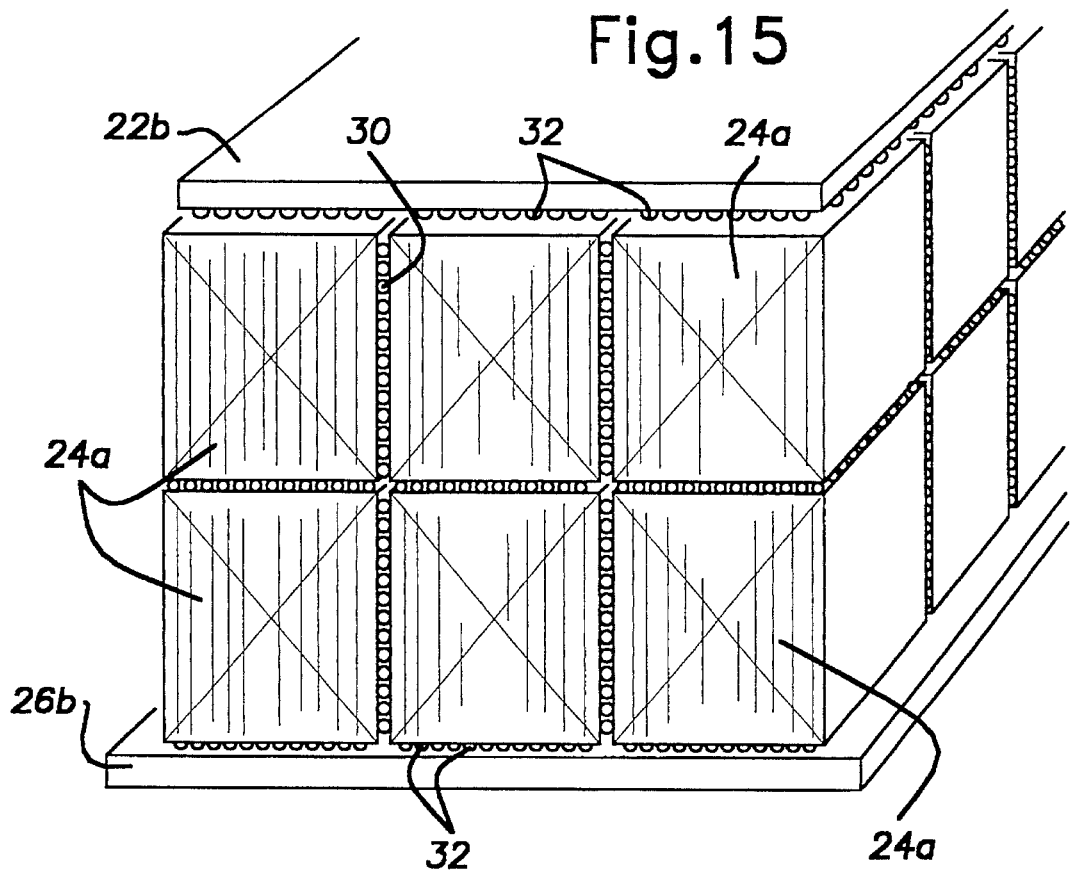
FIG. 15 Diagrammatically another three-dimensional device according to the invention.

FIG. 15 diagrammatically and partially illustrates another detection device according to the invention, which has not one but several, e.g. two rows of blocks 24a, the blocks of one row being respectively connected, by welding microbeads 32, to the blocks of the other row, each edge of a chip of one block of one row being hybridized in this way to the edge of a chip of a block of the other row.

The group of blocks obtained is then hybridized on one side to a detection array 22b and on the other to an interconnection network support 26b by welding microbeads 32.

For hybridizations relative to the devices of FIGS. 14 and 15, reference should again be made to document (2).

It is possible to produce other devices according to the invention. Thus, it is possible to manufacture a block having one or more stacks of chips and then hybridize, on two chosen faces of said block, a detection array and an interconnection network support.

We claim:

1. Device for the detection of radiation comprising:
   a detection array (22) for receiving the radiation and for supplying signals representing said radiation;
   a circuit (24) for reading the signals supplied by the detection array, said reading circuit including a block having at least one stack of integrated circuits (28) constituting elementary reading circuits;
   an electrical output component (26) electrically connected to the reading circuit; and
   wherein said detection array and said electrical output component are respectively fixed to two separate faces of the block, said elementary reading circuits (28) are hybridized to one another by welding microbeads (30), and said detection array (22) and the electrical output component (26) are hybridized to the corresponding faces of the block by welding microbeads (32).

2. Device according to claim 1, wherein said detection array (22) and the electrical output component (26) are respectively fixed to two opposite faces of the block, each of these two opposite faces being formed by juxtaposed edges (29) of the elementary reading circuits (28).

3. Device according to claim 1, wherein said block comprises at least two stacks (24a) of the integrated circuits fixed to one another by faces of the elementary reading circuits.

4. Device according to claim 1, wherein said block comprises at least two stacks (24a) of the integrated circuits fixed to one another by faces formed by juxtaposed edges of elementary reading circuits.

5. Device according to claim 1, wherein faces (42, 46) of the elementary reading circuits (28) are electrically connected to edges (29) thereof in order to receive information supplied by the detection array (22).

6. Device according to claim 1, further comprising cooling means (36) for cooling the block by four other faces thereof.

7. Device according to claim 1, wherein said electrical output component is an interconnection network support (26).

8. Device according to claim 1, wherein said electrical output component is able to process the signals which the reading circuit can supply.

9. Process for the production of a device for detecting radiation comprising a detection array for receiving the radiation and for supplying signals representing the radiation, a circuit for reading the signals supplied by the detection array, the reading circuit including a block having at least one stack of integrated circuits constituting elementary reading circuits, and an electrical output component electrically connected to the reading circuit, said process comprising the steps of:

producing the integrated circuits constituting the elementary reading circuits (28), each integrated circuit comprising, on one of its two faces, welding elements (68) for hybridization of said integrated circuit to another of the integrated circuits;

hybridizing said elementary reading elements (28) to one another so as to form the stack (24) of integrated circuits;

resin encapsulating gaps between hybridized integrated circuits;

machining two opposite faces (74a, 74b) of the stack formed by juxtaposed edges of the elementary reading circuits so as to flatten said two opposite faces;

treating said two opposite faces to form groups of electrical connections intended to be respectively associated with the detection array (22) and the electrical output component (26); and hybridizing the detection array and the electrical output component to the corresponding faces of the stack.

10. Device for the detection of radiation comprising:
    a detection array (22) for receiving the radiation and for supplying signals representing the radiation;
    a circuit (24) for reading the signals supplied by the detection array, said reading circuit including a block having at least one stack of integrated circuits (28) constituting elementary reading circuits;
    an electrical output component (26) electrically connected to the reading circuit; and
    wherein said detection array and said electrical output component are respectively fixed to two separate faces of the block, faces of said elementary reading circuits (28) are hybridized to one another by welding microbeads (30), and said detection array (22) and the electrical output component (26) are hybridized to the corresponding faces of the block by welding microbeads (32).

* * * * *